United States Patent [19]
Hattori et al.

[11] Patent Number: 5,801,399
[45] Date of Patent: Sep. 1, 1998

[54] SEMICONDUCTOR DEVICE WITH ANTIREFLECTION FILM

[75] Inventors: Atsuo Hattori; Satoshi Hibino, both of Hamamatsu, Japan

[73] Assignee: Yamaha Corporation, Japan

[21] Appl. No.: 906,511

[22] Filed: Aug. 5, 1997

Related U.S. Application Data

[63] Continuation of Ser. No. 543,163, Oct. 13, 1995, abandoned.

[30] Foreign Application Priority Data

Oct. 13, 1994 [JP] Japan .................. 6-247776

[51] Int. Cl.$^6$ .......... H01L 27/108; H01L 29/04; H01L 31/0232; H01L 29/00
[52] U.S. Cl. .......... 257/69; 257/50; 257/53; 257/437; 257/530; 257/754
[58] Field of Search .......... 257/55, 53, 63, 257/754–5, 50, 52, 209, 529, 530, 437, 412, 770, 69

[56] References Cited

U.S. PATENT DOCUMENTS

| | | | |
|---|---|---|---|
| 4,378,628 | 4/1983 | Levinstein et al. | 257/754 |
| 4,609,930 | 9/1986 | Yamazaki | 257/63 |
| 4,924,294 | 5/1990 | Tanielian | 257/770 |
| 5,346,860 | 9/1994 | Wei | 247/754 |
| 5,373,169 | 12/1994 | McCollum et al. | 257/50 |
| 5,488,246 | 1/1996 | Hayashide et al. | 257/336 |

FOREIGN PATENT DOCUMENTS

| | | | |
|---|---|---|---|
| 5-267671 | 10/1993 | Japan | 257/754 |
| 6-132245 | 5/1994 | Japan . | |
| 6-132286 | 5/1994 | Japan . | |
| 6-349695 | 12/1994 | Japan . | |
| 7-86244 | 3/1995 | Japan . | |

*Primary Examiner*—Mahshid D. Saadat
*Assistant Examiner*—Teresa M. Arroyo

[57] ABSTRACT

A stress relaxation layer is inserted between an electrode layer and an antireflection layer to relax a stress imparted from one of the electrode and antireflection layers to the other. A semiconductor device is provided which can suppress separation of the antireflection film during device fabrication processes and dispense with the process of etching and removing the antireflection film.

4 Claims, 10 Drawing Sheets

SEMICONDUCTOR DEVICE WITH ANTIREFLECTION FILM

This is a continuation of U.S. patent application Ser. No. 08/543,163 filed on Oct. 13, 1995, now abandoned.

BACKGROUND OF THE INVENTION a) Field of the Invention

The present invention relates to a semiconductor device, and more particularly to a semiconductor device having an antireflection film formed on a conductive layer patterned by photolithography, the antireflection film having a function of reducing the intensity of light incident upon and reflected from the conductive layer.

b) Description of the Related Art

In order to improve the integration degree of semiconductor devices, it is necessary to form fine electrodes, fine capacitor electrodes, fine wiring patterns, and other fine constituent elements of each transistor. In order to form fine patterns of electrodes and wiring layers, antireflection layers have been utilized.

Conductive substances such as metals, silicide, and Si have a high reflectivity in the range of exposure wavelengths used for photolithography. If exposure light reflected from the surface of a conductive substance cannot be controlled, high precision of photolithography is not possible.

An antireflection film formed on a conductive film suppresses light reflection from the surface of a conductive film during a photolithography exposure process. The antireflection film prevents resist from being thinned by light reflection from the uneven surface of an underlie film, and prevents wiring from being thinned or broken off, thereby forming more precise electrode/wiring patterns.

Although the antireflection film is effective for forming fine electrode/wiring patterns, it contributes nothing to the function of a completed device itself. From this reason, the antireflection film has been etched and removed after electrode/wiring patterns are formed.

For example, an antireflection film of $SiN_x$ is removed by dry etching using $CF_4$ gas. In this dry etching, layers under the conductive film, such as the gate oxide film exposed at the substrate surface and even a surface under the exposed film such as a gate oxide film, may be etched and the device is damaged.

Although the antireflection film itself contributes nothing to the device function, it may be left in the device without removing it if the device function is not damaged.

If the removal of antireflection films by etching is dispensed with, damages to devices by etching can be avoided. Furthermore, omission of the etching process shortens a process time and improves manufacture yield. However, if a refractory metal silicide film is used as the conductive film and a silicon nitride film is used as the antireflection film, the antireflection film may be peeled from the conductive film at the interface therebetween when it is subjected to a heat treatment process at a high temperature, for example, 800° C. or higher, among the processes to be executed before the completion of the device. Separation of a film may lead to generation of particles or other undesired phenomena, resulting in low device manufacture yield. In order to omit the process of etching and removing an antireflection film, it is necessary to suppress separations during device fabrication processes.

SUMMARY OF THE INVENTION

It is an object of the present invention to provide a semiconductor device whose antireflection film is not necessary to be removed.

Between a conductive film formed on an uneven surface of a semiconductor substrate and an antireflection film formed on the conductive layer, a stress relaxation film is inserted which has a function of relaxing a stress generated between the conductive film and the antireflection film.

Since the stress relaxation film relaxes a stress generated between the conductive film and the antireflection film, separation (or delamination) of the antireflection film can be suppressed even if there is a heat treatment process among the device fabrication processes. The antireflection film can therefore be left in the device without removing it.

The process time can be shortened as compared to the case where antireflection films are etched and removed. Furthermore, since devices are not damaged by such etching processes, manufacture yield and reliability of semiconductor devices can be improved.

As above, a device structure having a stress relaxation film interposed between a conductive film and an antireflection film relaxes a stress generated between the conductive film and the antireflection film, and prevents separation of the antireflection film during device fabrication processes. Accordingly, the antireflection film can be left in the device and the etching process of the antireflection film becomes unnecessary.

DETAILED DESCRIPTION OF THE PREFERRED EMBODIMENTS

Effects of Antireflection Film

First, the effects of an antireflection film during the formation of a conductive pattern will be described, by taking as an example a process of forming a gate electrode of a CMOS transistor.

Figure 2A:
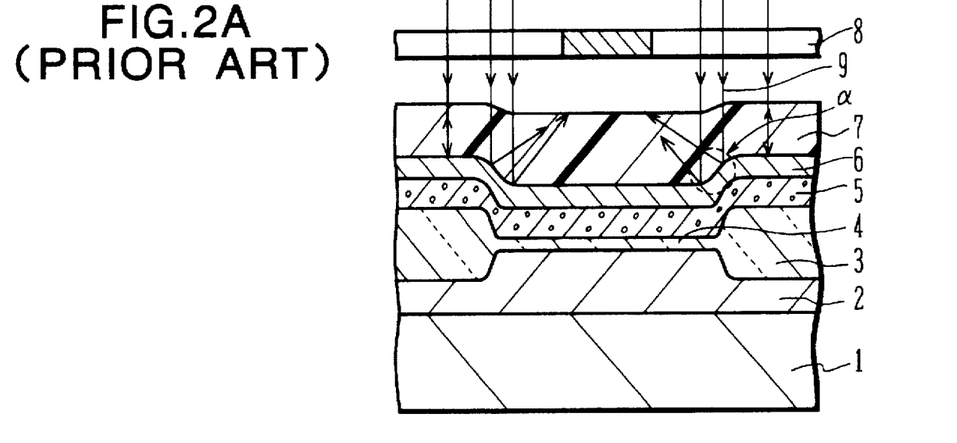
FIGS. 2A to 2C are cross sectional views illustrating processes of forming a gate electrode pattern without using an antireflection film.
Figure 2B:
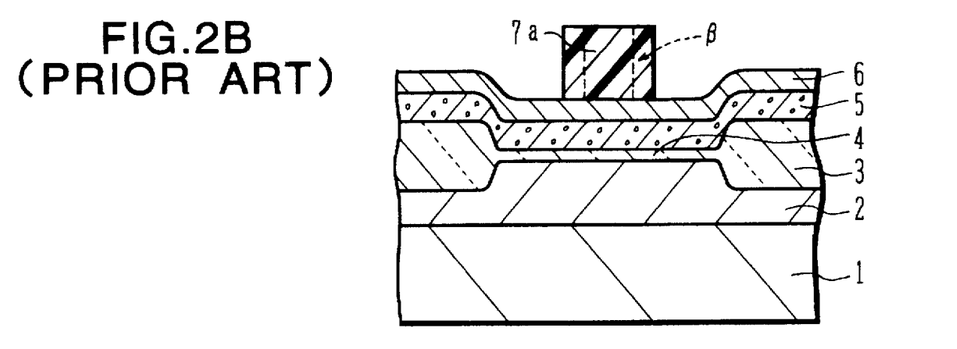
Figure 2C:
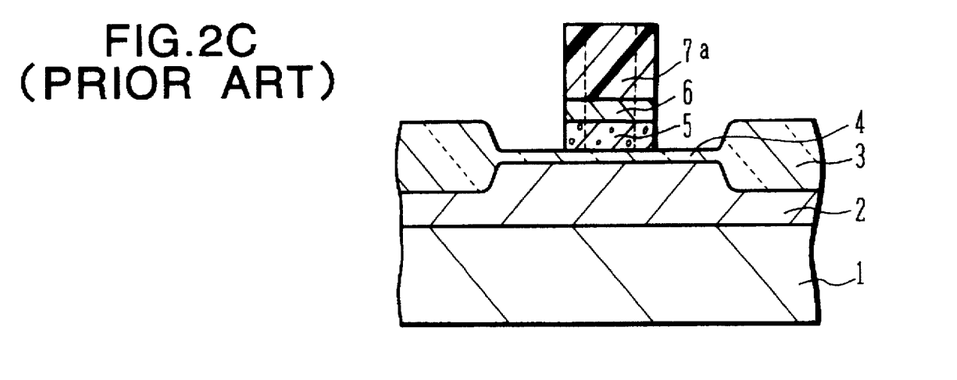

FIGS. 2A to 2C illustrate a conventional example of forming a gate electrode pattern of a CMOS transistor without using an antireflection film. As shown in FIG. 2A, in a p-type Si wafer (substrate) 1, an n-type well region 2 is formed by implantation of n-type impurity ions. On the n-type well layer, a continuous oxide film is formed which includes a thin gate oxide film 4 and a thick field oxide film 3, the gate oxide film 4 being formed by thermal oxidation of the substrate and the field oxide film 3 being formed by selective oxidation of the substrate. On the whole surface of this continuous oxide film, a conductive film is formed which is constituted by a polycrystalline Si film 5 and a metal silicide film 6 such as WSi respectively formed through chemical vapor deposition (CVD) and sputtering.

A resist film 7 is spin-coated on the surface of the metal silicide film 6, and exposed to light through a photomask 8.

Incoming light 9 passes through the resist film 7 and reflects at the surface of the underlying metal silicide film 6. As shown in FIG. 2A, if the surface of the metal silicide film 6 is uneven because of the influence of steps at the ends of the field oxide film 3, reflected light is converged like reflection by a concave mirror at the concave surface of the metal silicide film 6 as indicated by α in FIG. 2A. This phenomenon is called halation. This halation exposes the resist at the region which should not be exposed.

As shown in FIG. 2B, a resist pattern 7a formed through development after the exposure has a portion 7s thinned by halation as indicated by β. By using this resist pattern as a mask, an electrode layer constituted by the metal silicide film 6 and polycrystalline Si film 5 is etched. The thinned portion of the resist pattern 7s is directly reflected upon the electrode layer and a partially thinned gate electrode pattern is formed as shown in FIG. 7C.

Figure 3A:
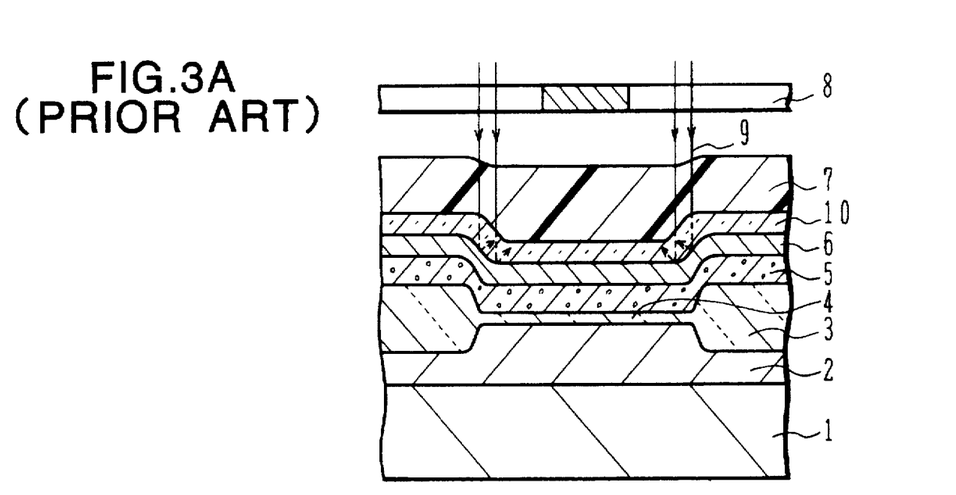
FIGS. 3A to 3C are cross sectional views illustrating processes of forming a gate electrode pattern by using an antireflection film.
Figure 3B:
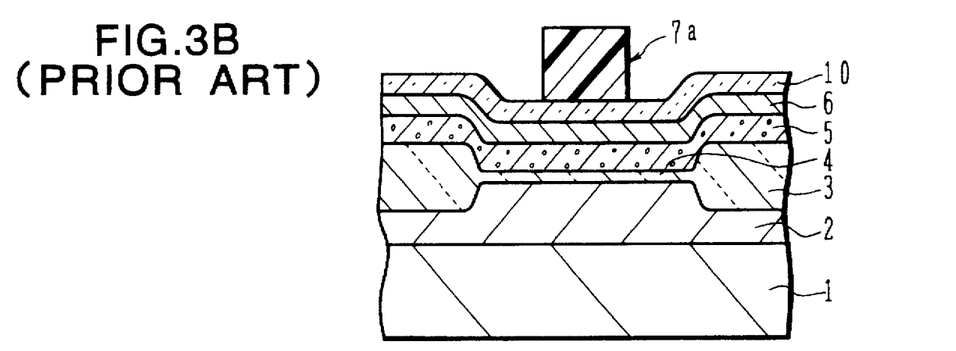
Figure 3C:
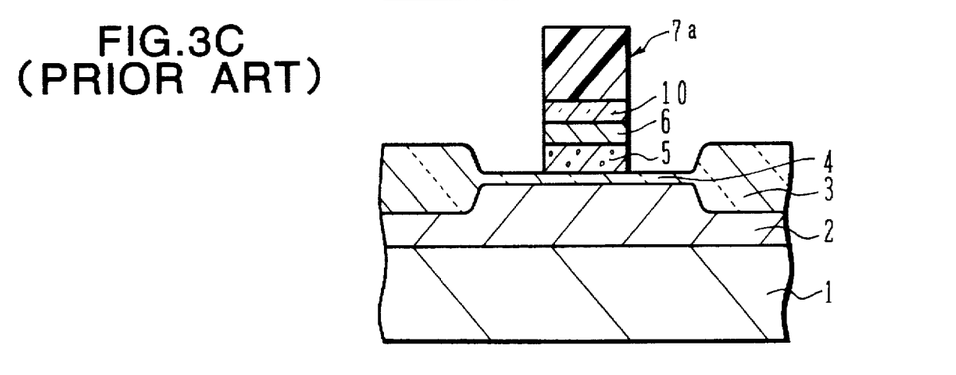

FIGS. 3A to 3C illustrate a process of forming a gate electrode pattern of a CMOS transistor by using an antireflection film. As shown in FIG. 3A, an antireflection film 10 such as $SiN_x$ is formed on the whole surface of a metal silicide film 6 by CVD or other processes. A resist film is formed on this antireflection film 10.

Light is exposed to the resist film through a photomask 8. Incoming light 9 from the photomask 8 enters the resist film and reaches the antireflection film 10. The incoming light 9 attenuates while it propagates in the antireflection film 10 so that the intensity of light reaching the surface of the metal silicide film 6 reduces. Light reflected from the surface of the metal silicide film 6 attenuates again while it propagates in the antireflection film 10.

The intensity of reflected light in the resist film 7 attenuates further if light reflected from the surface of the antireflection film 10 combines in opposite phase with light reflected from the surface of the metal silicide film 6. The influence of reflected light in the resist film is therefore relieved by the provision of the antireflection film 10.

As shown in FIG. 3B, a resist pattern 7a formed through development after the exposure has a good pattern without any partially thinned portion. By using this resist pattern as a mask, the antireflection film 10, metal silicide film 6, and polycrystalline silicon film 5 are etched. The results are an electrode having a good pattern as shown in FIG. 3C.

As described above, the antireflection film contributes much to the formation of a good resist pattern on a conductive film which reflects exposure light. Although the antireflection film is an indispensable film for precisely patterning a conductive layer, it contributes nothing to the device function itself. From this reason, the antireflection layer has been etched and removed conventionally after the conductive layer is patterned. For example, after the resist pattern 7a is ashed by 02 plasma, the antireflection film 10 is removed by dry etching using CF4. During this dry etching process, the films not intended to be etched may be etched or Si layers may be damaged.

With Unremoved Antireflection Film

If the antireflection film is an insulating film, it can be treated in the same manner as an overlaid insulating film, and if the antireflection film is a conducive layer, it can be treated in the same manner as the underlying conductive film. Therefore, even if the antireflection film is left in the final device, there is nothing particular to hinder the device function. Rather, if the antireflection film is unnecessary to be removed, damages to the device during the etching process can be avoided by omitting the etching process.

However, if the antireflection film of $SiN_x$ is formed on the conductive film of WSi, the $SiN_x$ film may be separated or delaminated from the WSi conductive film during a heat treatment process at 800° C. or higher among device fabrication processes. Generation of this separation is required to be suppressed if the $SiN_x$ film is to be left in the device without removing it. The materials of the conductive film and antireflection film are not limited only to WSi and $SiN_x$. Separation problems may also occur for various other combinations of materials for conductive films and antireflection films.

One of the reasons of separation may be considered as resulting from a stress generated at an interface between laminate films by volume contraction of the refractory metal layer during the heat treatment process. Other factors such as a weak coupling force between laminate films and a large Young's modulus of film materials make it easy to separate the antireflection film.

Adoption of Stress Relaxation Layer

Various structures of a stress relaxation layer sandwiched between a refractory metal silicide layer and an antireflection layer were tested for confirming the function of relaxing a stress generated between the refractory metal silicide layer and antireflection layer.

Materials of a stress relaxation layer are selected which satisfies as many conditions as possible from the followings. The conditions include a small Young's modulus, a relatively soft material having an amorphous structure, a strong chemical coupling force at a laminate film interface, and a material having the main composition same as the antireflection film and/or electrode film. It is preferable that the material also satisfies the conditions such as no hinderance of an antireflection effect of the antireflection film, and no excessive burden on a device fabrication processes.

For example, for a conductive film of WSi and an antireflection film $SiN_x$, the stress relaxation film material may be amorphous Si, polycrystalline Si, Si compounds such as $SiO_2$ and SiON, amorphous C, phosphorus silicate glass (PSG), boron silicate glass (BSG), and boron phosphorus silicate glass (BPSG). Amorphous Si may contain impurities such as H, F, B, and P.

Stress Relaxation Layer of Amorphous Si

Amorphous Si was selected from the above-described materials as a material of the stress relaxation layer and CMOS transistors were manufactured. The influence of the stress relaxation layer upon the film separation and antireflection performance was evaluated.

Figure 1A:
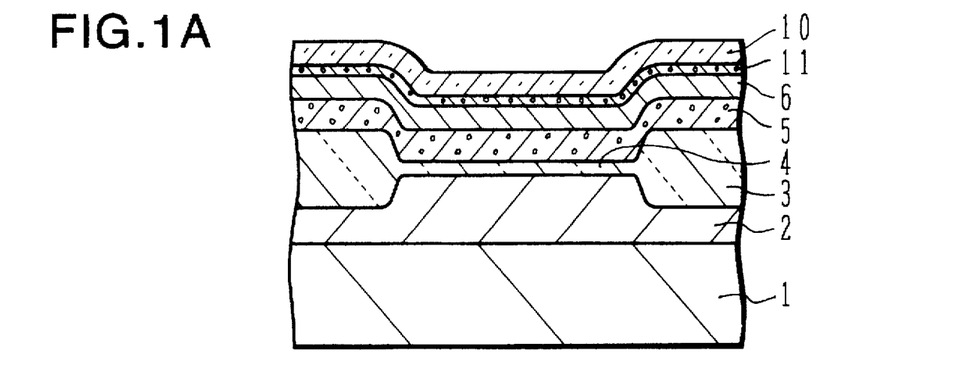
FIGS. 1A to 1I are cross sectional views illustrating processes of manufacturing a semiconductor device according to an embodiment of the invention.

The processes of manufacturing CMOS transistors include processes similar to those of forming a gate electrode using an antireflection film described in connection with FIGS. 3A to 3C. The manufacture of a p-channel MOS transistor of a CMOS will be described. As shown in FIG. 1A, a p-type Si substrate 1 with an n-type well region 2 formed therein was prepared. On the Si substrate 1, a thick field oxide film 3 and a thin gate oxide film 4 were formed, the gate oxide film 4 being surrounded by the field oxide film 3 and having a thickness of about 10 nm. A polycrystalline Si film 5 was deposited by CVD to a thickness of 150 nm on the whole surface of the oxide films 3 and 4. A WSi film 6 was formed by sputtering to a thickness of 200 nm on the whole surface of the polycrystalline Si film 5. These processes are similar to those described with reference to FIG. 2A. An stress relaxation layer 11 of amorphous Si was sputtered on the WSi film 6. The film forming conditions were a sputtering target of Si, a process gas of Ar, a pressure of 8 mTorr, an RF power output of 1 kW, and a substrate temperature of 200° C. The film thickness of the stress relaxation film on the CMOS transistor was changed in the range from 0 nm to 30 nm.

An antireflection film 10 of $SiN_x$ was formed by reactive sputtering on the whole surface of the amorphous Si film 11. The film forming conditions were a sputtering target of Si, a process gas of $N_2$, a pressure of 8 mTorr, an RF power output of 1 kW, and a substrate temperature of 200° C. The film thickness of the antireflection film 10 on the CMOS transistor was changed in the range from 20 nm to 70 nm.

The amorphous Si layer 11 and $SiN_x$ film 10 can be formed by sputtering using the same target material of Si. Therefore, both the amorphous Si layer 11 and $SiN_x$ film 10 may be continuously formed in the same film forming chamber. The amorphous Si layer 11 and $SiN_x$ film may also be formed by CVD.

Similar to the processes described with reference to FIGS. 2A and 3A, a positive resist film was spin-coated on the whole surface of the $SiN_x$ antireflection film 10. After a predetermined pre-baking, exposure was performed via a photomask.

Figure 1B:
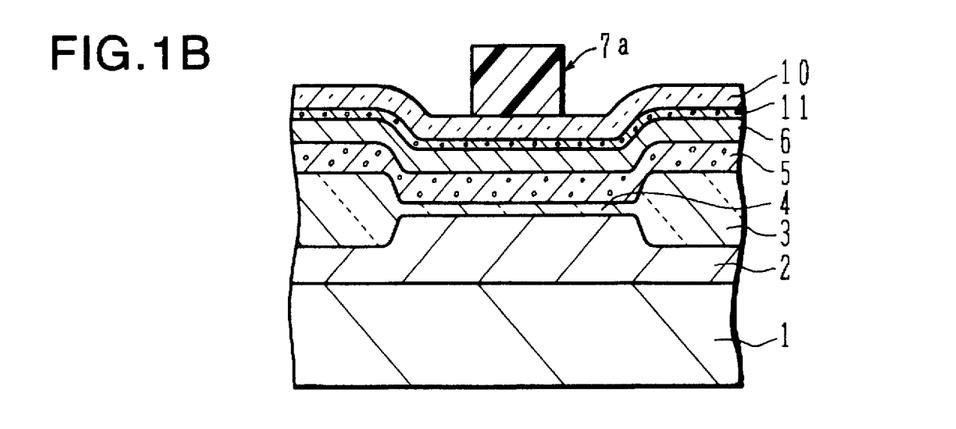

As shown in FIG. 1B, the resist film was developed to obtain a resist pattern 7a.

Figure 1C:
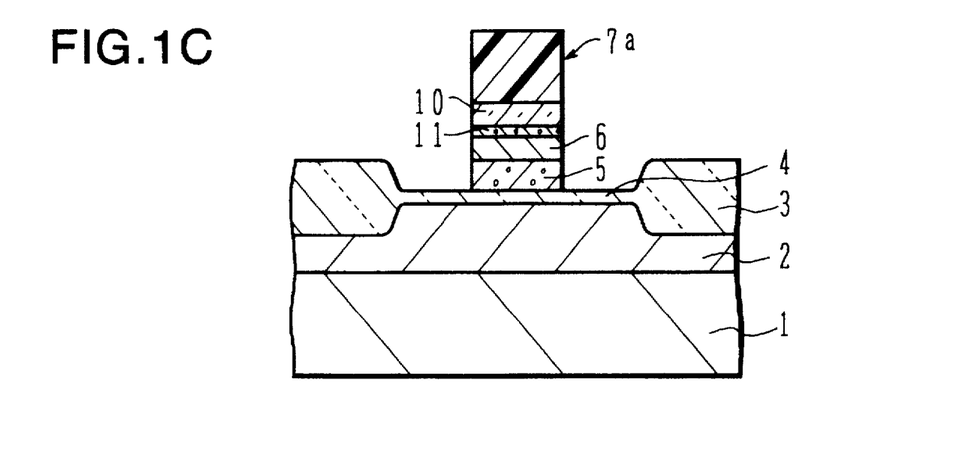

As shown in FIG. 1C, by using this resist pattern 7a as a mask, the $SiN_x$ film 10 was dry-etched by using a mixed gas of $CF_4$, $CHF_3$, and Ar. By using the patterned $SiN_x$ film 10 as a mask, the amorphous Si layer 11 and a laminate polycide layer constituted by the WSi layer 6 and polycrystalline Si film 5 were etched by using a mixed gas of $Cl_2$, $O_2$, and He or a mixed gas of HBr and $SF_6$ to obtain a gate electrode pattern as shown in FIG. 1C.

The etched pattern of the polycide layer forms the gate electrode as shown in FIG. 1C as well as a wiring pattern at a different area, for example, over the field oxide film on the same substrate.

The processes of forming a device after the formation of the gate electrode pattern are similar to general device forming processes.

Figure 1D:
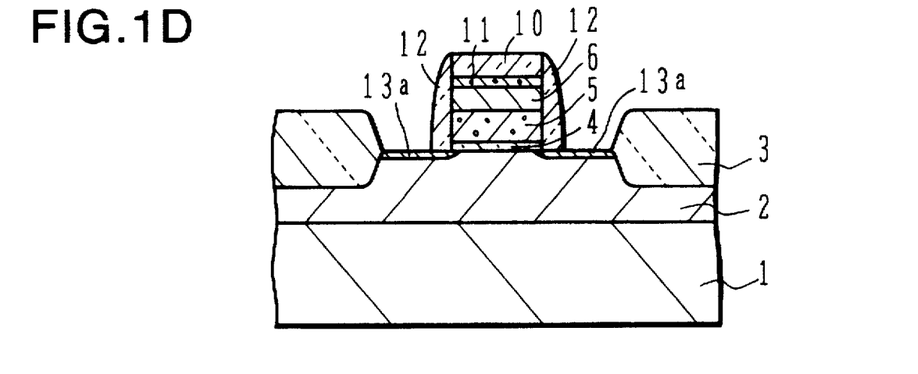

As shown in FIG. 1D, by using the gate electrode as a mask, p-type impurity ions such as $BF_2^+$ are implanted to form regions 13a of a lightly doped drain (LDD) structure. Thereafter, side spacers 12 of insulating material are formed covering only the side walls of the electrode. These side spacers 12 are formed by conformally depositing an $SiO_2$ film and anisotropically patterning the SiO2 film through reactive ion etching (RIE) to leave it only on the side walls of the gate electrode. The $SiO_2$ film may conformally formed on the silicon oxide film and gate electrode by low pressure CVD using tetraethoxysilane (TEOS).

Figure 1E:
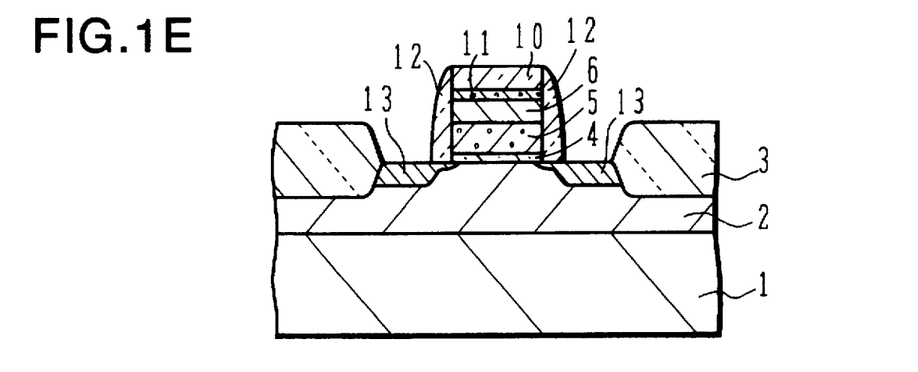

As shown in FIG. 1E, $BF_2^+$ ions are implanted in the surface region of the substrate between the side spacers 12 on the side surfaces of the gate electrode and the field oxide films 3 to form source/drain regions 13 of high impurity concentration. Thereafter, the substrate is subjected to annealing in a rapid thermal annealer (RTA) by raising from the room temperature to 850° C. in 10 seconds, maintaining the temperature of 850° C. for 10 seconds, and lowering the temperature in 30 seconds to the room temperature, to thereby activate the doped impurity ions.

Figure 1F:
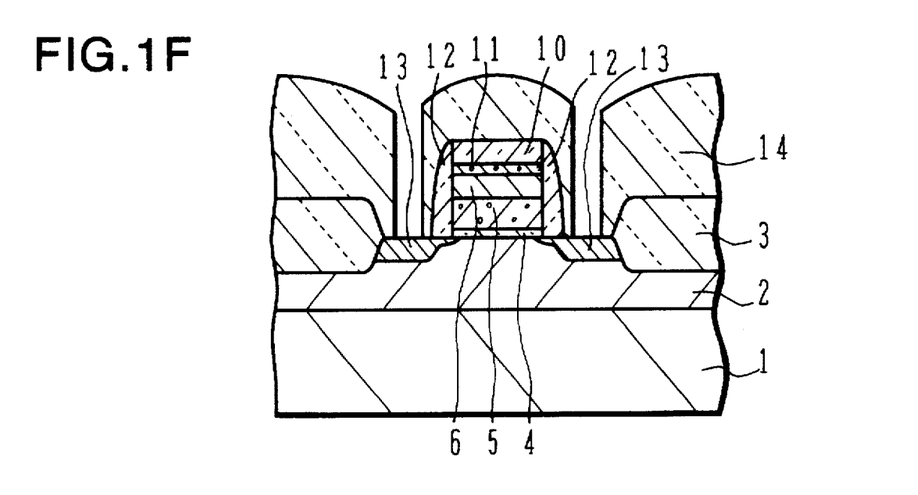

As shown in FIG. 1F, a laminate having a thickness of about 700 nm and made of two layers of PSG and BPSG is formed over the whole surface of the substrate by atmospheric pressure CVD. Thereafter, the laminate is reflowed and planarized in RTA to form an interlayer insulating film 14, under the conditions that the temperature is raised from the room temperature to 1000° C. or higher in 10 seconds, maintained at 1000° C. or higher for 10 seconds, and lowered to the room temperature in 30 seconds. Thereafter, contact holes are formed in the interlayer insulating film 14 by photolithography.

During the annealing processes for impurity activation and for PSG (BPSG) re-flow, a conventional antireflection film is often separated from the conductive layer. In this embodiment, such separation can be prevented as will be later detailed.

Figure 1G:
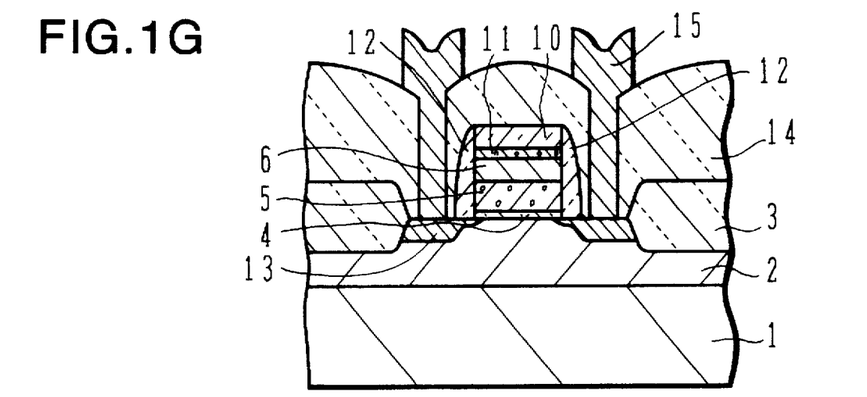

As shown in FIG. 1G, on the whole surface of the interlayer insulating film 14, WSi and next an Al alloy containing Si and Cu are sputtered to form an electrode film and thereafter this film is patterned into a desired wiring pattern 15. Also, separation of the antireflection film used for halation prevention may occur if there is no stress relaxation film, when an interlayer insulating film is next formed to cover the wiring pattern 15 and is subjected to reflow annealing.

Figure 1H:
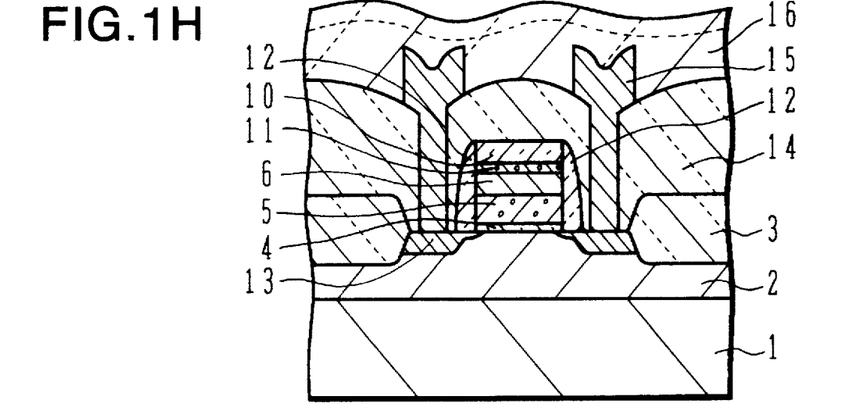
Figure 1I:
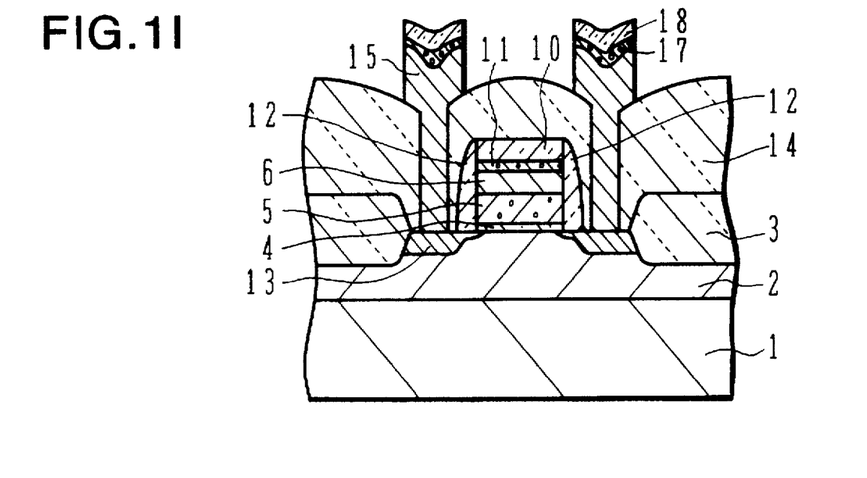

As shown in FIG. 1I, a stress relaxation layer 17 and an antireflection film 18 may be formed and left on the patterned electrode (wiring) to prevent halation and separation. The wiring layer may be Al alloy or may be selected from a group consisting of Al, Cu, W, Mo, Ti, and Ni.

The n-channel transistor of the CMOS may be manufactured by similar processes as described above. Of course, the conductivity type should be reversed. The region which should not be ion-implanted is covered by a resist film.

As shown in FIG. 1H, a passivation film 16 made of two layers of PSG and $SiN_x$ is formed by plasma CVD. Windows are formed in the passivation film 16 and finally the substrate is subjected to annealing in a hydrogen atmosphere at a temperature of 400° C. In the above manner, a CMOS transistor device is completed.

For the devices with an amorphous Si stress relaxation layer 11 manufactured by the above-described processes, the influence of the stress relaxation film upon the antireflection effect and the effect of separation prevention were evaluated. A silicon oxide film was grown 15 nm thick through heat treatment of an Si substrate, and thereafter a polycrystalline Si film was deposited 150 nm thick by CVD. After phosphor ions were diffused, a WSi film having a thickness of 200 nm was formed by sputtering.

The influence of the stress relaxation film upon the antireflection effect was evaluated by using samples formed by the processes described with FIG. 1A, i.e., by using samples obtained immediately after the WSi film 6, stress relaxation film 11 of amorphous Si, and antireflection film 10 are formed over the substrate. The thickness of the amorphous Si stress relaxation layer was changed from 0 nm (without using the stress relaxation layer), to 5 nm, 10 nm, and 15 nm. The thickness of the $SiN_x$ antireflection film was changed from 20 nm to 60 nm at a step of 10 nm, respectively for each thickness of the amorphous Si stress relaxation layer. A reflectivity relative to an exposure wavelength was measured for each sample.

Figure 4:
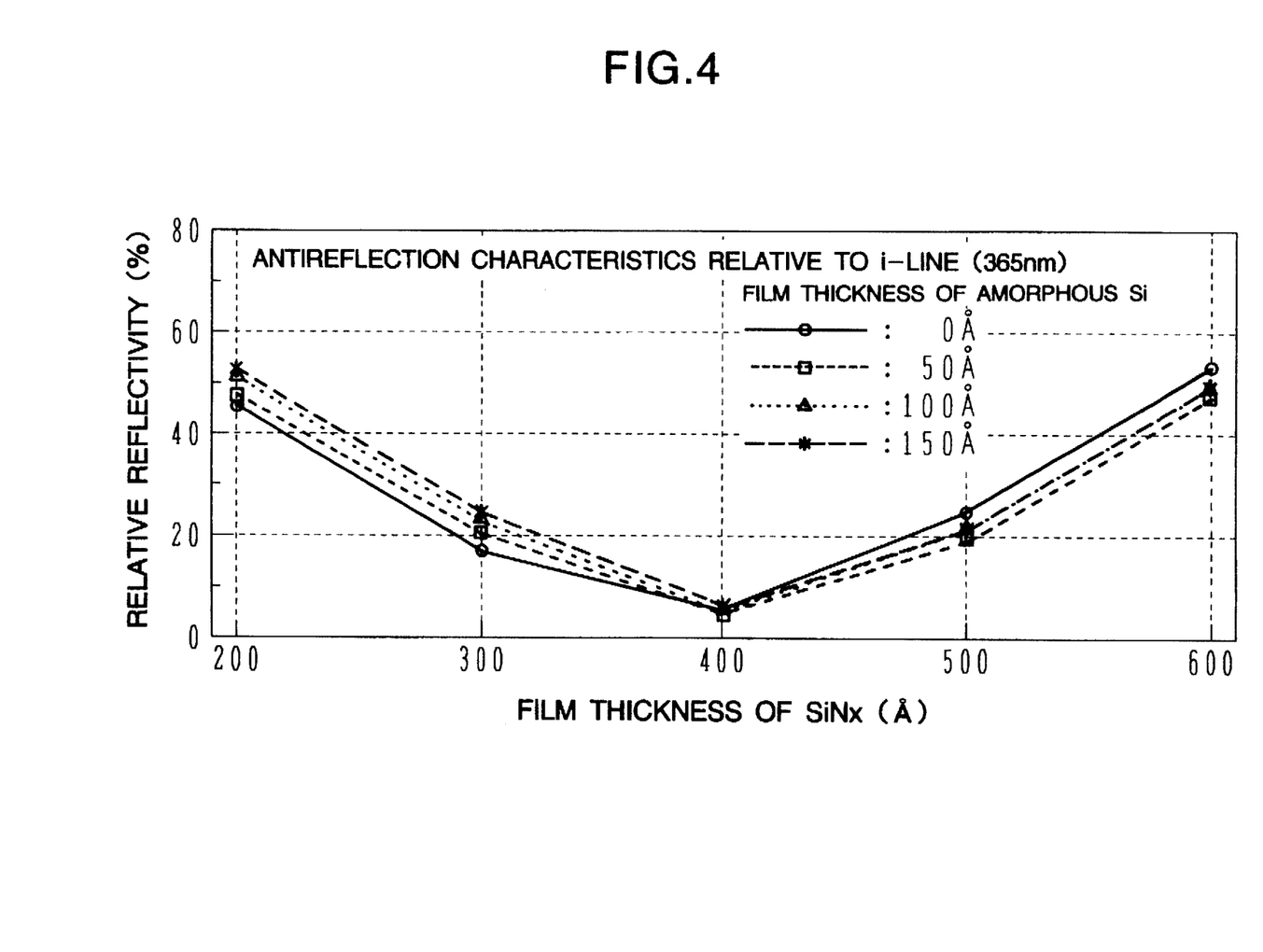
FIG. 4 is a graph showing an example of the antireflection characteristics of antireflection films of semiconductor device according to an embodiment of the invention.
Figure 5:
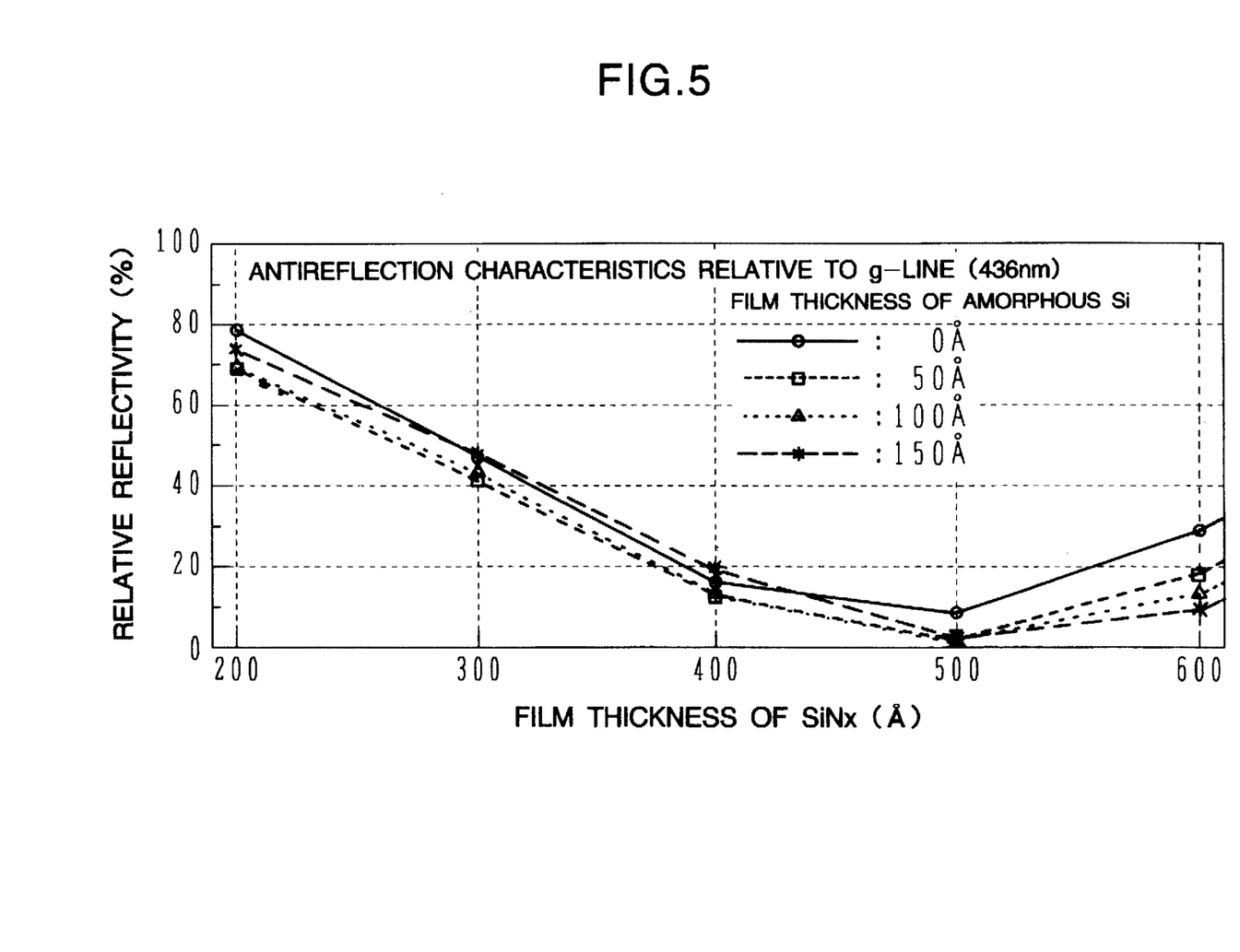
FIG. 5 is a graph showing another example of the antireflection characteristics of antireflection films of a semiconductor device according to the embodiment of the invention.

FIGS. 4 and 5 show the measured relative reflectivities for the i-line 365 nm and g-line 436 nm of a mercury lamp, respectively, as an exposure light, relative to the 100% reflectivity of the substrate. The abscissa represents a thickness of the $SiN_x$ film, and the ordinate represents a relative reflectivity. The lower the reflectivity, the greater the antireflection effect. Data indicated by a circle symbol corresponds to the substrate without the stress relaxation layer.

As shown in FIG. 4, in the case of the i-line, the optimum thickness of $SiN_x$ for reducing the reflectivity was about 30 nm to 50 nm and preferably about 40 nm, irrespective of the thickness of the amorphous Si film. As shown in FIG. 5, in the case of the g-line, the optimum thickness of the $SiN_x$ antireflection film was about 40 nm to 60 nm and preferably about 50 nm. It was found that the provision of amorphous Si did not hinder the antireflection effect in a general sense. Rather, the provision of amorphous Si improved the antireflection effect under the condition of the thickness of the $SiN_x$ film in excess of 50 nm.

The antireflection effect was less hindered with the provision of the stress relaxation layer, and a good gate electrode pattern was formed.

Figure 6A:
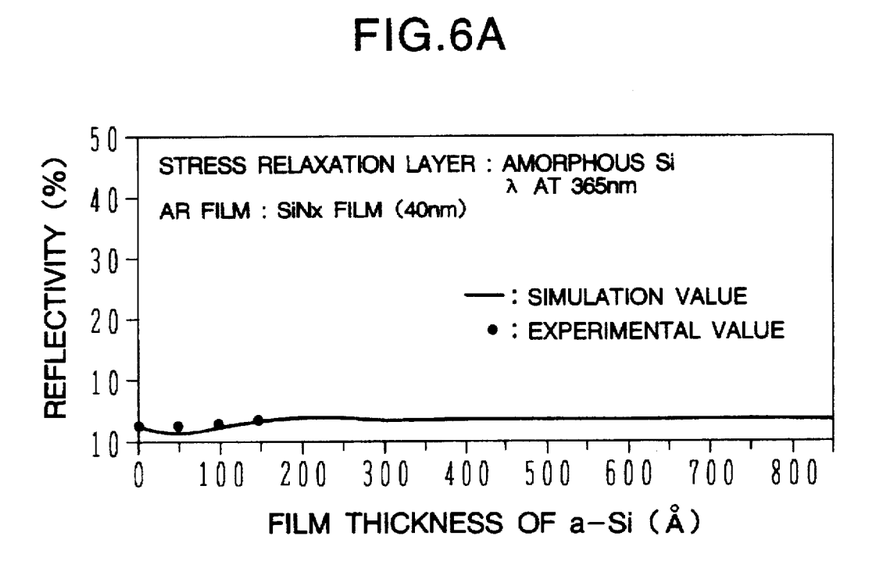
FIGS. 6A and 6B are graphs showing an example of the antireflection characteristics obtained through simulation.
Figure 6B:
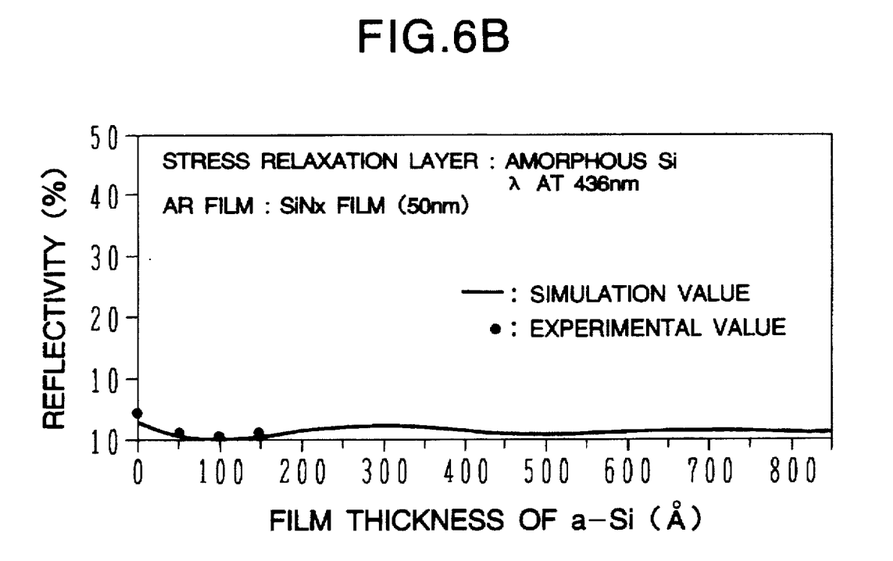

FIGS. 6A and 6B show the simulated reflectivities for the i-line 365 nm and g-line 436 nm exposure light at each thickness of an amorphous Si film adopted as the stress relaxation layer. The abscissa represents a thickness of the amorphous Si film, and the ordinate represents a reflectivity. As the reflectivity, an absolute reflectivity was used relative to the 100% reflectivity of an ideal mirror. The film structure is a three-layer structure having a WSi film, an amorphous Si film formed thereon, and an $SiN_x$ antireflection film formed on the amorphous Si film.

FIG. 6A shows the reflectivities for the i-line 365 nm. The simulation data was calculated under the conditions that the thickness of the $SiN_x$ film was set to 40 nm which is a thickness providing the highest antireflection effect relative to the i-line, the real part (n) of the complex refractive index (N) of the $SiN_x$ film was 2.03, the imaginary part (k) thereof was the real part (n) of the complex refractive index (N) of the amorphous Si film was 5.1, and the imaginary part (k) thereof was −3.1.

FIG. 6B shows the reflectivities for the g-line 436 nm. The simulation data was calculated under the conditions that the thickness of the $SiN_x$ film was set to 50 nm which is a thickness providing the highest antireflection effect relative to the g-line, the real part (n) of the complex refractive index (N) of the $SiN_x$ film was 1.99, the imaginary part (k) thereof was the real part (n) of the complex refractive index (N) of the amorphous Si film was 5.2, and the imaginary part (k) thereof was −1.4.

In FIGS. 6A and 6B, the experimentally obtained values are indicated by black circles. Significant coincidence between experiment values and simulation values indicates high reliability of the simulation values. In the simulation, the reflectivities were simulated for a thickness from 0 nm to 100 nm of the amorphous Si film. A variation of the reflectivities for exposure light for both the i- and g-lines was 5% or lower in the range of the film thickness of 0 nm to 100 nm.

Similar to FIGS. 6A and 6B, FIGS. 7A and 7B show the simulated reflectivities for the i-line 365 nm and g-line 436 nm exposure light at each thickness of a polycrystalline Si film adopted as the stress relaxation layer.

Figure 7A:
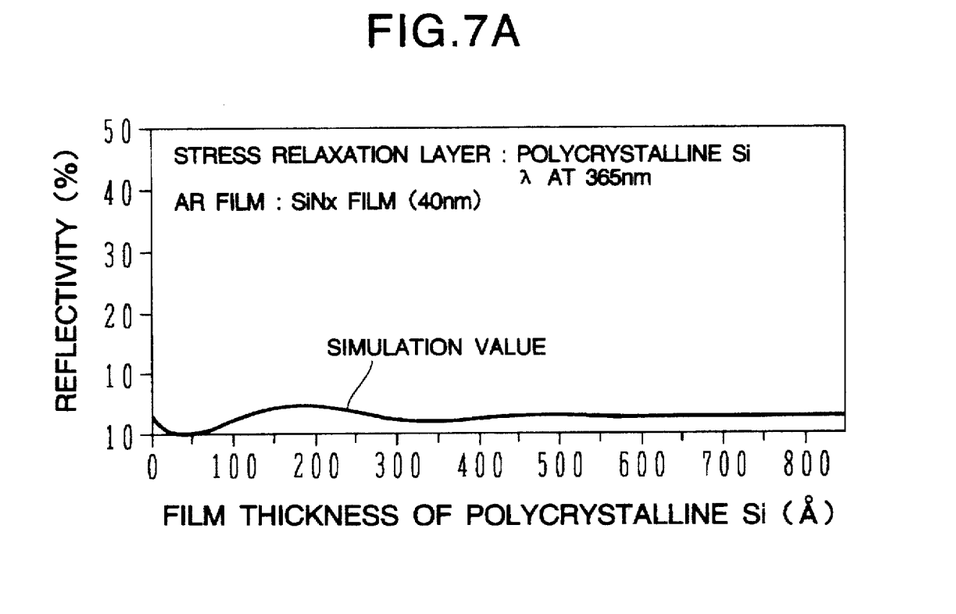
FIGS. 7A and 7B are graphs showing another example of the antireflection characteristics obtained through simulation.
Figure 7B:
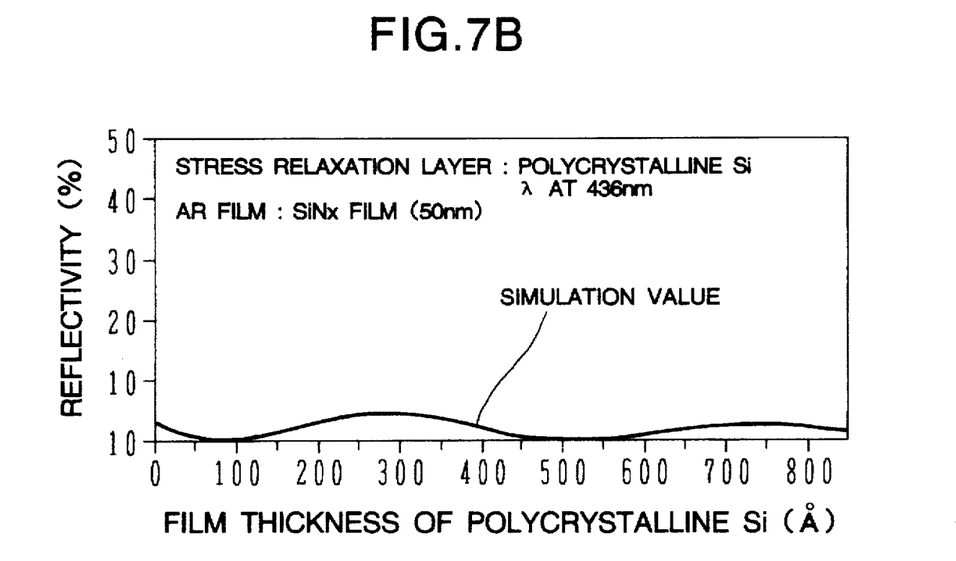

FIG. 7A shows the reflectivities for the i-line 365 nm. The simulation data was calculated under the conditions that the real part (n) of the complex refractive index (N) of polycrystalline Si was 6.03, and the imaginary part (k) thereof was FIG. 7B shows the reflectivities for the g-line 436 nm. The simulation data was calculated under the conditions that the real part (n) of the complex refractive index (N) of polycrystalline Si was 4.96, and the imaginary part (k) thereof was −0.48. The other conditions were similar to the simulation described with reference to FIGS. 6A and 6B.

As shown in FIGS. 7A and 7B, the reflectivities are low even if the thickness of the polycrystalline Si film is increased. It can be expected from this result that the antireflection effect of the $SiN_x$ film is deteriorated less when polycrystalline Si is used as the material of the stress relaxation layer.

The separation prevention effect of the stress relaxation layer relative to the antireflection film was checked by using samples obtained immediately after the annealing process at 850° C. after the source/drain regions were formed. Whether there is a separation of the $SiN_x$ film was observed with a microscope by changing the thickness of the amorphous Si film 11 in the range from 0 nm to 30 nm. The thickness of the $SiN_x$ film was set to 40 nm.

Although separation of the antireflection film occurred for the amorphous Si stress relaxation film thinner than 10 nm, no separation was observed for the antireflection film equal to or thicker than 10 nm. The sample without separation was also free of separation during the later heat treatment process. Although it is preferable that the thickness of the amorphous Si film is 10 nm or more, new problems with the thickness of 100 nm or more occur, such as difficult works at the following processes and a complicated planarizing process.

As appreciated from the above description, the provision of an amorphous Si stress relaxation film between a WSi film and an $SiN_x$ antireflection film suppressed separation of the antireflection film during heat treatment processes among the device fabrication processes, while retaining the antireflection effect, even if the antireflection film is left unremoved.

In the above embodiment, the WSi gate electrode film is used as the conductive film. Obviously, other conductive films may be adopted, without limiting only to the gate electrode.

The conductive layer which is patterned by using an antireflection film is not limited to a gate electrode, but it is needless to say that other wiring/electrode patterns are also applied.

Figure 8:
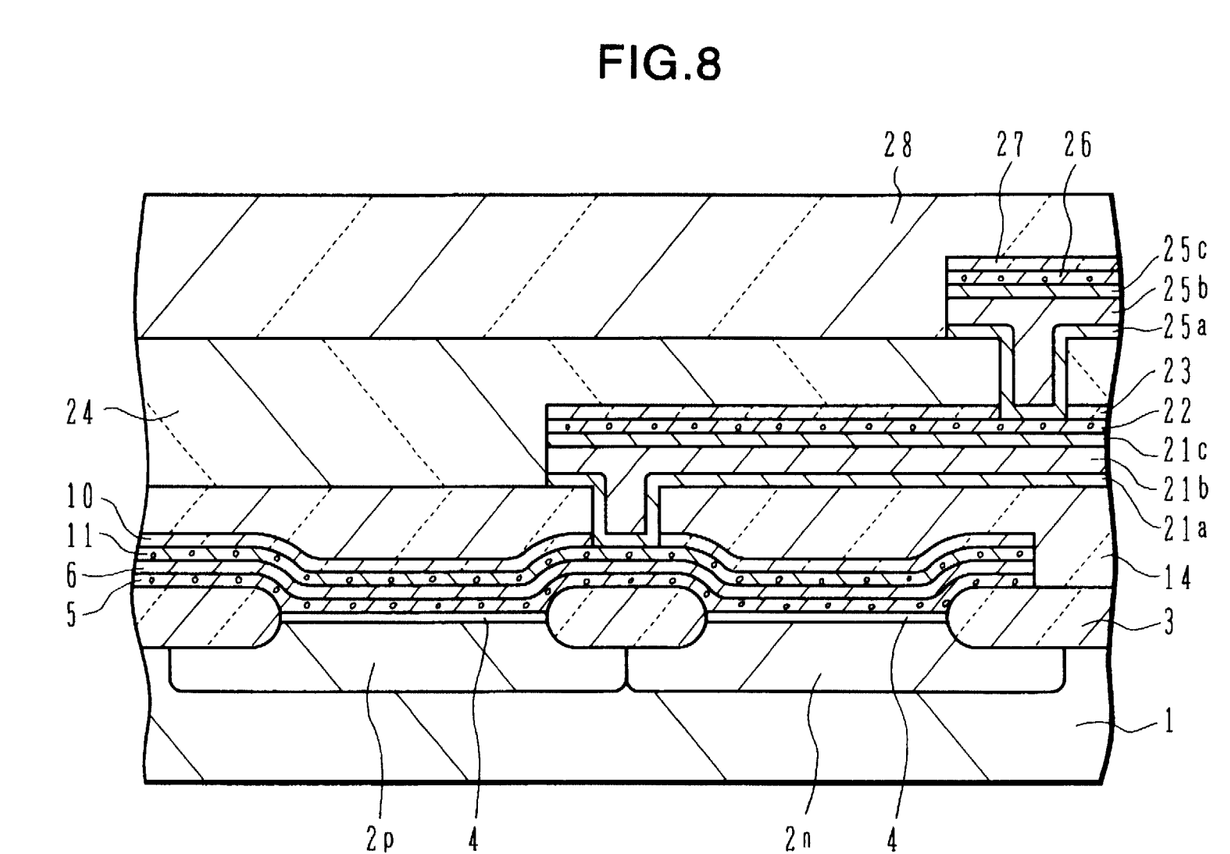
FIG. 8 is a cross sectional view of a semiconductor device having a multi-layer wiring according to another embodiment of this invention.

For example, as shown in FIG. 8, similar to the gate electrode of the embodiment described above, the invention is also applicable to a conductive film formed on an interlayer insulating film wherein a stress relaxation layer is formed on the conductive film, and an antireflection film is formed on the stress relaxation film. This structure provides a good wiring pattern and the antireflection film can be left unetched.

In the above embodiment, only the process of forming the p-channel device elements of the CMOS transistor has been described. During the CMOS fabrication processes, n-channel device elements are also formed. The p- and n-channel device elements are alternately formed by repeating similar processes such as ion implantation by covering an unnecessary region with a resist mask. In forming the n-channel, $P^+$ or other ions such as $As^+$ are doped.

FIG. 8 shows an example of the structure of a CMOS semiconductor device. On the surface of a p-type Si substrate 1, a p-type well region 2p and an n-type well region 2n are formed being separated by a field oxide film 3. Gate oxide films 4 are formed on the surface of the p- and n-type well regions 2p and 2n over the channel regions thereof. Common gate electrodes are formed on the gate oxide films 4. Source/drain regions are disposed on opposite sides of the channel regions in the direction perpendicular to the drawing sheet. The gate electrode is formed by a polycrystalline Si layer 5, a refractory metal silicide layer 6, and an amorphous Si stress relaxation layer 11. A TiN antireflection film 10 is formed on the surface of the stress relaxation layer 11. The surface of the gate electrode (inclusive of the TiN film) is covered with an interlayer insulating film 14 made of PSG, BPSG, or the like. Via holes are formed in the interlayer insulating film 14 at predetermined areas to expose the gate electrode. A first wiring layer is formed on the interlayer insulating film 14, covering the via holes. The first wiring layer is a laminate of a Ti film 21a, an Al alloy layer 21b, a Ti layer 21c, and a polycrystalline Si layer 22. The polycrystalline Si layer 22 functions as a stress relaxation layer. On the polycrystalline Si layer 22, a TiN antireflection layer 23 is formed. The surface of the first wiring layer (inclusive of the TiN film) is covered with an interlayer insulating film 24. Via holes are formed in the interlayer insulating film 24 at predetermined areas to expose the surfaces of the first wiring layer. A second wiring layer is formed on the interlayer insulating film 24, covering the via holes. The second wiring layer is a laminate of a Ti layer 25a, an Al alloy layer 25b, a Ti layer 25c, and a polycrystalline Si layer 26. The polycrystalline Si layer 26 functions as a stress relaxation layer. On the polycrystalline Si layer 26, a TiN antireflection layer 27 is formed. The surface of the second wiring layer (inclusive of the TiN film) is covered with an interlayer insulating film 28.

In the structure shown in FIG. 8, the antireflection films 10 and 23 are removed at the via hole areas to expose the underlying polycrystalline Si layers 11 and 22. Instead, the polycrystalline Si layers 11 and 22 may also be removed at the via hole areas to have contacts with the underlying metal silicide layer and Ti layer.

Although the two-layer wiring structure over the gate electrode is shown, the wiring structure may be formed by three or more wiring layers. Also in this case, the connection between adjacent wiring layers is established in the same manner as that between the first and second wiring layers. A single wiring layer may have contacts with a plurality of underlying wiring layers.

Although an application to CMOS gate electrodes for n- and p-channel MOS transistors has been described, it is obvious that gate electrodes for NMOS transistors containing only n-channel MOS transistors or PMOS transistors containing only p-channel MOS transistors are also applicable.

Silicide compound of refractory metals other than WSi may be used as the silicide conductive film. For example, silicide compounds of metals such as Mo, Ti, Ta, Pt, Co, and Ni may be used. The conductive material other than metal silicide may also be used, such as a material selected from a group consisting of Al, Al alloy, Cu, W, Mo, Ti, and Ni.

In addition to $SiN_x$ and TiN, the material of the antireflection film may be SiON, amorphous Si, $TiO_2$, TiON, or the like. Although the materials usable as the antireflection film and stress relaxation film are duplicated, it is apparent that the same material cannot be selected for both the films.

In addition to amorphous Si and polycrystalline Si, the material of the stress relaxation film may be Si compounds such as $SiO_2$ and SiON, amorphous C, phosphorus silicate glass (PSG), boron silicate glass (BSG), and boron phosphorus silicate glass (BPSG). Amorphous Si may contain impurities such as H, F, B, and P.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A semiconductor device comprising:

a semiconductor substrate having an uneven surface;

a first layer made of conductive material and formed on the semiconductor substrate in a predetermined pattern;

a second layer formed directly on the first layer, and having the same predetermined pattern as the first layer; and a third layer formed directly on the second layer, and having the same predetermined pattern as the first and second layers, the third layer being an antireflection film made of material different from the first and second layers, the composition and arrangement of the antireflection film being such as to lower an intensity of light incident to and reflected from the first layer, wherein the second layer has a composition different from the first and third layers, the composition and arrangement of the second layer being such as to cause relaxing of any stress generated between the first and third layer, the first layer comprising WSi, the second layer comprising amorphous silicon or polycrystalline silicon, and the third layer comprising $SiN_x$.

2. A semiconductor device according to claim 1, wherein the second layer comprises amorphous silicon and has a film thickness of 10 nm or more.

3. A semiconductor device according to claim 1, wherein the first layer is a wiring layer or a gate electrode of the semiconductor device.

4. A semiconductor device comprising:

a semiconductor substrate having an uneven surface;

a first layer made of conductive material and formed on the semiconductor substrate in a predetermined pattern;

a second layer formed directly on the first layer, and having the same predetermined pattern as the first layer; and a third layer formed directly on the second layer, and having the same predetermined pattern as the first and second layers, the third layer being an antireflection film made of material different from the first and second layers, the composition and arrangement of the antireflection film being such as to lower an intensity of light incident to and reflected from the first layer, wherein the second layer has a composition different from the first and third layers, the composition and arrangement of the second layer being such as to cause relaxing of any stress generated between the first and third layers, the second layer comprising a material selected from the group consisting of amorphous silicon, polycrystalline silicon, amorphous carbon, SiON, PSG, BPSG and BSG.

* * * * *